(12) United States Patent
Chang et al.

(10) Patent No.: US 10,818,664 B2
(45) Date of Patent: Oct. 27, 2020

(54) METHOD OF FORMING SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/512,306

(22) Filed: Jul. 15, 2019

(65) Prior Publication Data

US 2019/0341386 A1 Nov. 7, 2019

Related U.S. Application Data

(62) Division of application No. 16/027,267, filed on Jul. 4, 2018, now Pat. No. 10,446,554.

(30) Foreign Application Priority Data

Aug. 21, 2017 (CN) .......................... 2017 1 0717163

(51) Int. Cl.
*H01L 27/108* (2006.01)
*H01L 49/02* (2006.01)
(Continued)

(52) U.S. Cl.
CPC .......... *H01L 27/10814* (2013.01); *G11C 7/02* (2013.01); *G11C 11/4074* (2013.01);
(Continued)

(58) Field of Classification Search
CPC ......... H01L 27/10814; H01L 27/10823; H01L 27/10852; H01L 27/10897;
(Continued)

(56) References Cited

U.S. PATENT DOCUMENTS

| 5,292,677 A | 3/1994 | Dennison |
| 5,488,011 A | 1/1996 | Figura |

(Continued)

FOREIGN PATENT DOCUMENTS

| CN | 1705129 A | 12/2005 |
| CN | 101740572 A | 6/2010 |

(Continued)

*Primary Examiner* — Khamdan N. Alrobaie
(74) *Attorney, Agent, or Firm* — Winston Hsu

(57) ABSTRACT

A method of forming semiconductor memory device, the semiconductor memory device includes a substrate, plural gates, plural cell plugs, a capacitor structure and a stacked structure. The gates are disposed in the substrate, and the cell plugs are disposed on the substrate, to electrically connect the substrate at two sides of each gate. The capacitor structure includes plural capacitors, and each capacitor is electrically connected each cell plug. The stacked structure covers the capacitor structure, and the stacked structure includes a semiconductor layer, a conductive layer on the semiconductor layer and an insulating layer stacked on the conductive layer. Two gaps are defined respectively between a side portion of the insulating layer and a lateral portion of the conductive layer at two sides of the capacitor structure, and the two gaps have different lengths.

12 Claims, 14 Drawing Sheets

(51) Int. Cl.
*G11C 11/4074* (2006.01)
*G11C 7/02* (2006.01)
*G11C 11/404* (2006.01)

(52) U.S. Cl.
CPC .. *H01L 27/10823* (2013.01); *H01L 27/10852* (2013.01); *H01L 27/10876* (2013.01); *H01L 27/10885* (2013.01); *H01L 27/10891* (2013.01); *H01L 27/10897* (2013.01); *H01L 28/90* (2013.01); *G11C 11/404* (2013.01); *H01L 27/10855* (2013.01)

(58) Field of Classification Search
CPC ............... H01L 27/10876; H01L 28/90; H01L 27/10891; H01L 27/10885; H01L 27/10855; G11C 11/4074; G11C 7/02; G11C 11/404
See application file for complete search history.

(56) References Cited

U.S. PATENT DOCUMENTS

| | | | |
|---|---|---|---|
| 5,872,041 A * | 2/1999 | Lee | H01L 27/10817 257/306 |
| 5,895,239 A * | 4/1999 | Jeng | H01L 27/10844 257/E21.646 |
| 5,955,774 A | 9/1999 | Kang | |
| 6,074,908 A | 6/2000 | Huang | |
| 6,165,839 A | 12/2000 | Lee | |
| 6,184,082 B1 | 2/2001 | Hsieh | |
| 6,204,119 B1 | 3/2001 | Lange | |
| 6,211,079 B1 | 4/2001 | Jenq | |
| 6,312,982 B1 | 11/2001 | Takato | |
| 6,475,855 B1 * | 11/2002 | Fishburn | H01L 27/10811 257/E21.018 |
| 6,486,025 B1 | 11/2002 | Liu | |
| 6,492,224 B1 * | 12/2002 | Jao | H01L 21/76229 257/E21.008 |
| 6,844,230 B2 * | 1/2005 | Reinberg | H01L 28/91 257/E21.013 |
| 7,538,007 B2 | 5/2009 | Ahn | |
| 7,723,770 B2 | 5/2010 | Choi | |
| 8,508,982 B2 | 8/2013 | Ohgami | |
| 2002/0022317 A1 | 2/2002 | Fukuzumi | |
| 2003/0087499 A1 * | 5/2003 | Lane | H01L 21/76877 438/396 |
| 2005/0218439 A1 * | 10/2005 | Lee | H01L 27/10855 257/296 |
| 2009/0315143 A1 | 12/2009 | Jung | |
| 2010/0227463 A1 | 9/2010 | Cho | |
| 2014/0312460 A1 | 10/2014 | Lee | |
| 2016/0336311 A1 | 11/2016 | Kim | |
| 2019/0109013 A1 | 4/2019 | Chang | |

FOREIGN PATENT DOCUMENTS

| | | |
|---|---|---|
| JP | 3452763 B2 | 9/2003 |
| WO | 96/14663 | 5/1996 |

* cited by examiner ated as an essential portion in many electronics. A conventional DRAM device may include plural memory cells arranged into an array for data storage. Each memory cell may include a metal oxide semiconductor (MOS) transistor and a capacitor serially connected to the MOS transistor.
METHOD OF FORMING SEMICONDUCTOR MEMORY DEVICE

CROSS REFERENCE TO RELATED APPLICATIONS

This application is a Divisional of application Ser. No. 16/027,267 filed Jul. 4, 2018, and included herein by reference.

BACKGROUND OF THE INVENTION

1. Field of the Invention

The present invention generally relates to a semiconductor memory device and a method of forming the same, and more particularly, to a dynamic random access memory (DRAM) device and a method of forming the same.

2. Description of the Prior Art

A dynamic random access memory (DRAM) device is one kind of volatile memory that has been widely incorporated as an essential portion in many electronics. A conventional DRAM device may include plural memory cells arranged into an array for data storage. Each memory cell may include a metal oxide semiconductor (MOS) transistor and a capacitor serially connected to the MOS transistor.

As the dimension of a DRAM device continues to shrink for higher integrity, it has been more and more difficult to fabricate the interconnecting structure for electrically connecting the memory cells. Meanwhile, various cell designs for forming DRAM devices that may have the transistors and capacitors configured structurally differently are still required to fulfill product needs and achieve a higher device density. Therefore, it is still intensively studied in the field to provide a DRAM device with improved performance and a manufacturing method thereof.

SUMMARY OF THE INVENTION

One objective of the present invention is to provide a semiconductor memory device, in which, a capacitor structure formed on a substrate is covered by a stacked structure, and a length of a lateral portion of the stacked structure covering on the substrate is reduced by being etched. Therefore, the direct contact between the lateral portion of the stacked structure and a peripheral plug may be prevented. Better device reliability may also be achieved.

Another objective of the present invention is to provide a method of forming a semiconductor memory device, in which, a stacked structure disposed on a capacitor structure is etched by multiple etching processes including a wet etching process. A length of a lateral portion of the stacked structure that covers on the substrate and extends toward a peripheral region may be reduced. Therefore, the unexpected direct shorting problem in subsequent manufacturing process may be prevented.

To achieve the aforesaid objective, one embodiment of the present invention provides a semiconductor memory device. The semiconductor memory device includes a substrate, a plurality of gates, a plurality of cell plugs, a capacitor structure and a stacked structure. The gates are disposed in the substrate. The cell plugs are disposed on the substrate and are respectively electrically connected to the substrate at two sides of the gates. The capacitor structure is disposed on the substrate and comprises a plurality of capacitors that are respectively electrically connected to one of the cell plugs. The stacked structure covers on the capacitor structure and includes a semiconductor layer, a conductive layer disposed on the semiconductor layer and an insulating layer disposed on the conductive layer, wherein two gaps are defined respectively between a side portion of the insulating layer and a lateral portion of the conductive layer at two sides of the capacitor structure, and the two gaps have different lengths.

To achieve the aforesaid objective, one embodiment of the present invention provides a method of forming a semiconductor memory device. The method includes the following steps. First, a substrate is provided. A capacitor structure is then formed on the substrate. The capacitor structure includes a plurality of capacitors. Following, a stacked structure is formed on the capacitor structure and covers the capacitor structure and a portion of the substrate. The stacked structure includes an insulating layer. Subsequently, a mask layer is formed on the stacked structure and covers the stacked structure and the capacitor structure. After that, a first etching process is performed to partially remove the insulating layer through the mask layer to form a patterned insulating layer. Thereafter, after removing the mask layer, a second etching process is performed to further remove the stacked structure through the patterned insulating layer.

One of the features of the present invention is that, the portion of the stacked structure that extends toward a peripheral region is etched in a stage-by-stage manner by multiple etching processes including a wet etching process. The method provided by the present invention may have an enlarged process window when forming plugs connected to the peripheral region and the semiconductor memory device formed by the method may obtain better device reliability. By using the method provided by the present invention, the space between the memory cell region and the peripheral region of a semiconductor memory device may be further reduced and therefore a higher degree of integrity and increased device density may be achieved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 3 are schematic cross-sectional diagrams illustrating the steps of forming a semiconductor memory device according to a first preferred embodiment of the present invention, in which:

FIG. 1 is a cross-sectional diagram of the semiconductor memory device after forming a mask layer;

FIG. 2 is a cross-sectional diagram of the semiconductor memory device after performing an etching process; and FIG. 3 is a cross-sectional diagram of the semiconductor memory device after forming plugs.

FIG. 4 to FIG. 6 are schematic cross-sectional diagrams illustrating the steps of forming a semiconductor memory device according to a second preferred embodiment of the present invention, in which:

FIG. 4 is a cross-sectional diagram of the semiconductor memory device after forming a mask layer;

FIG. 5 is a cross-sectional diagram of the semiconductor memory device after performing an etching process; and FIG. 6 is a cross-sectional diagram of the semiconductor memory device after performing another etching process.

FIG. 8 to FIG. 13 are schematic cross-sectional diagrams illustrating the steps of forming a semiconductor memory device according to a third preferred embodiment of the present invention, in which:

FIG. 8 is a cross-sectional diagram of the semiconductor memory device after forming a mask layer;

FIG. 9 is a cross-sectional diagram of the semiconductor memory device after performing a first etching process;

FIG. 10 is a cross-sectional diagram of the semiconductor memory device after performing a second etching process;

FIG. 11 is a cross-sectional diagram of the semiconductor memory device after performing a third etching process;

FIG. 12 is a cross-sectional diagram of the semiconductor memory device after performing a fourth etching process; and FIG. 13 is a cross-sectional diagram of the semiconductor memory device after forming the plugs.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
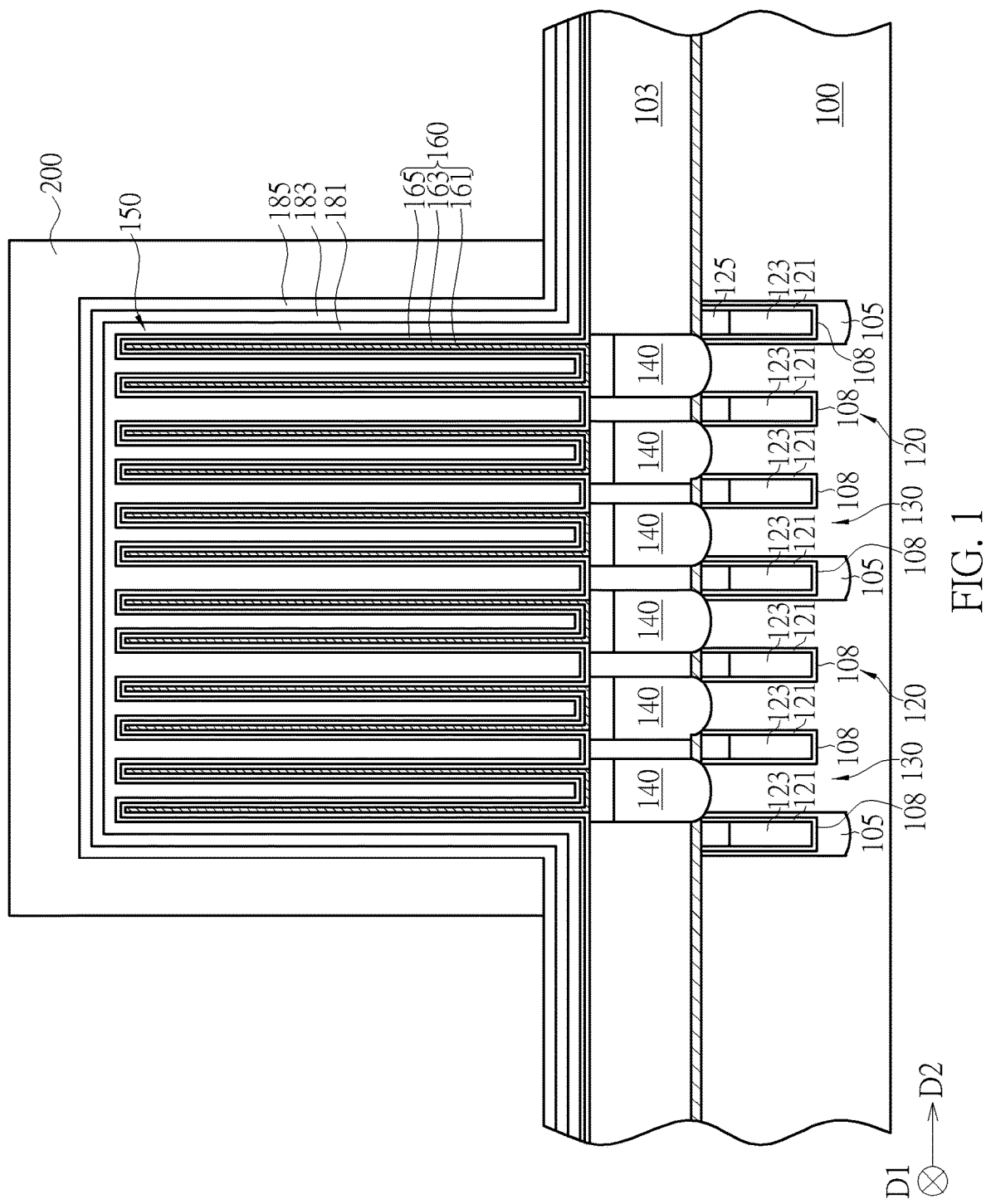
Figure 2:
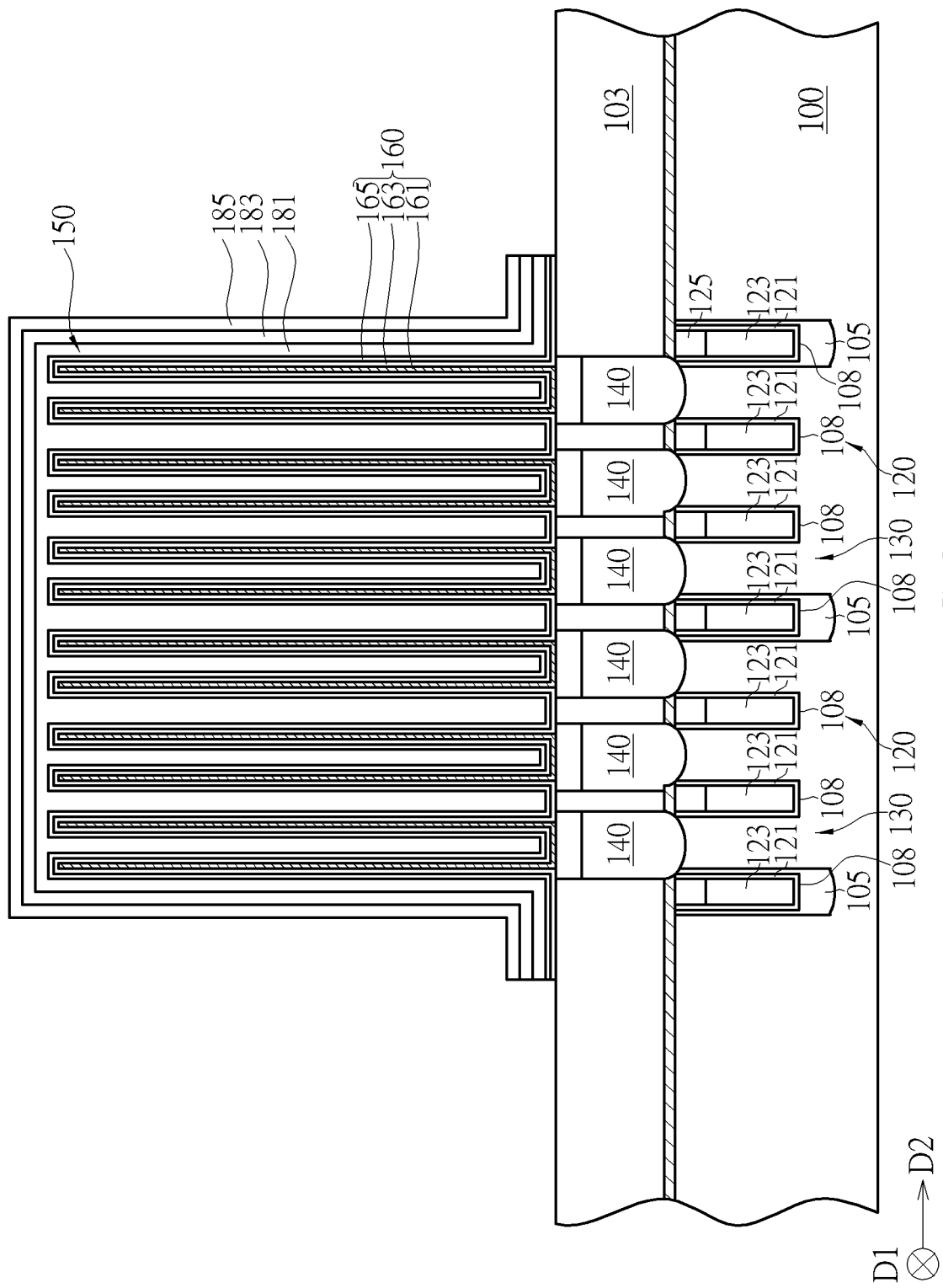
Figure 3:
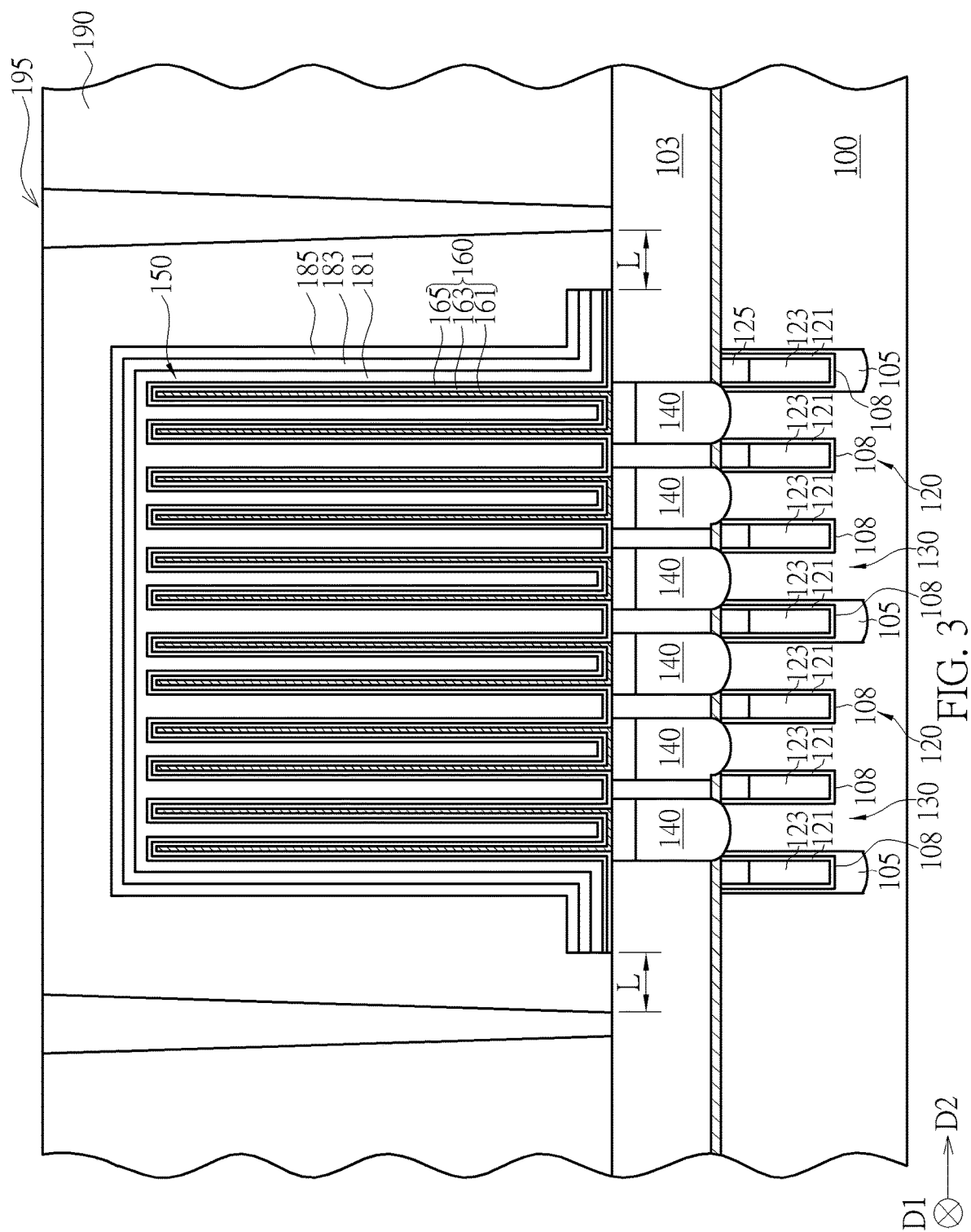

Please refer to FIG. 1 to FIG. 3, which are schematic cross-sectional diagrams illustrating the steps of forming a semiconductor memory device according to a first preferred embodiment of the present invention. The semiconductor memory device may be a dynamic random access memory (DRAM) device including at least a memory cell for data storage. The memory cell may include a transistor and a capacitor. The memory cell may be controlled by a bit line (BL) and a word line (WL) connected to the memory cell.

According to an embodiment, the semiconductor memory device includes a substrate 100. The substrate 100 may be a silicon substrate, a silicon-containing substrate, such as SiC or SiGe, or a silicon-on-insulator (SOI) substrate, but not limited thereto. At least a shallow trench isolation structure (STI) is formed in the substrate 100. As shown in FIG. 1, a shallow trench isolation structure 105 is formed in a memory cell region (not shown) of the substrate 100 to define a plurality of active regions (not shown). Furthermore, another shallow trench isolation structure (not shown) may be formed in the substrate to isolate the memory cell region from a peripheral region (not shown) of the substrate 100 outside the memory region. According to an embodiment, the shallow trench isolation structure 105 may be formed by etching the substrate 100 to form a trench and then filling an insulating material into the trench. For example, the insulating material may be silicon oxide, silicon nitride or silicon oxynitride, but not limited thereto.

A plurality of word lines may be formed in the substrate 100. According to the embodiment, the word lines are buried word lines 120. The buried word lines 120 respectively extend along a first direction D1 and are arranged in parallel. Each of the buried word lines 120 cuts through the active regions and the shallow trench isolation structure 105 along the first direction D1, and therefore has some portions buried in the active regions and other portions buried in the shallow trench isolation structure 105. As shown in FIG. 1, each buried word line 120 includes at least a gate dielectric layer 121, a gate layer 123 and a cap layer 125. For example, the gate dielectric layer 121 may include silicon oxide ($SiO_2$), but not limited thereto. The gate layer 123 may include a low resistance metal material such as tungsten (W), aluminum (Al) or copper (Cu), but not limited thereto. The cap layer 125 may include a dielectric material such as silicon nitride (SiN), silicon oxynitride (SiON), or silicon carbon nitride (SiCN), but not limited thereto. According to an embodiment, the word lines 120 may be formed by the following process. First, a plurality of word line trenches 108 may be formed in the substrate 100. A gate dielectric layer 121 that conformally and completely covers the surface of each word line trench 108, a gate layer 123 that fills the lower-half portion of each word line trench 108 and a cap layer 125 that fills the upper-half portion of each word line trench 108 may be successively formed in the word line trenches 108 by performing a series of deposition, etching and planarization processes. The cap layer 125 is preferably flush with the substrate. A portion of the buried word line 120 cut through the active region of the substrate 100 and the doped regions (not shown) in the active region at two sides of the buried word line 120 are configured to form a transistor 130, as shown in FIG. 1.

Please still refer to FIG. 1. A dielectric layer 103 is formed on the memory cell region of the substrate 100 and a capacitor structure 150 is formed on the dielectric layer 103. The capacitor structure 150 may include a plurality of capacitors 160. Each of the capacitors 160 is electrically connected to one of the doped regions in the substrate 100 through one of the cell plugs 140 formed in the dielectric layer 103 and a silicide layer (not shown) formed on the surface of the substrate 100. Therefore, each capacitor 160 may serve as a storage node (SN) and is configured with a transistor 130 in the substrate 100 into a memory cell. A plurality of memory cells are arranged into a DRAM array. In detail, each capacitor 160 may include a bottom electrode 161, a top electrode 165 and a capacitor dielectric layer 163 sandwiched between the bottom electrode 161 and the top electrode 165. For example, the bottom electrode 161 and the top electrode 165 may respectively include a conductive material including tungsten (W), titanium (Ti), titanium nitride (TiN), tantalum (Ta), tantalum nitride (TaN), aluminum (Al) or a combination thereof, but not limited thereto. The capacitor dielectric layer 163 may include a dielectric material having a dielectric constant larger than 4, such as hafnium oxide ($HfO_2$), but not limited thereto. It should be noticed that, in the illustrated embodiment, the capacitor 160 having the capacitor dielectric layer 163 and the top electrode 165 conformally covering on each bottom electrode 161 is only for example and should not limit the scope of the present invention. The capacitors of the semiconductor memory device may be formed in other configurations based on product requirements. According to various embodiments, the capacitor dielectric layer may cover each bottom electrode and further fills up the space of each bottom electrode, and the top electrode may be conformal to the shape of the capacitor dielectric layer rather than conformal to the shape of the bottom electrode.

Subsequently, by performing at least a deposition process, a stacked structure may be formed on the capacitor structures 150. The deposition process may include a chemical vapor deposition (CVD) process or a physical vapor deposition (PVD) process, but not limited thereto. According to an embodiment, the stacked structure may include a semiconductor layer 181, a conductive layer 183 on the semiconductor layer 181 and an insulating layer 185 on the conductive layer 183. For example, the semiconductor layer 181 may include semiconductor material such as polysilicon or silicon germanium (SiGe), but not limited thereto. The conductive layer 183 may include low-resistance material such as tungsten (W) or copper (Cu), but not limited thereto. The insulating layer 185 may include dielectric material such as silicon oxide, but not limited thereto. According to the embodiment, the semiconductor layer 181 directly covers the capacitor structure 150 and fills the spaces between the capacitors 160, and the conductive layer 183 and the insulating layer 185 are conformal to the semiconductor layer 181. Each layer of the stacked structure (including the semiconductor layer 181, the conductive layer 183 and the insulating layer 185) not only covers the entire capacitor structure 150, but also cover the substrate 100 and extends laterally from the sidewalls of the capacitor structure 150 toward the peripheral region outside the memory cell region, such as along a second direction D2 substantially parallel to the surface of the substrate on which the capacitor structure 150 is formed, as shown in FIG. 1.

A mask layer 200 is then formed on the stacked structure, and an etching process is then performed to remove a portion of the stack structure through the mask layer 200, thereby forming a patterned stack structure. According to the embodiment, as shown in FIG. 1, the mask layer 200 completely covers the capacitor structure 150 and also covers a portion of the substrate 100 adjacent to two sides of the capacitor structure 150. The lateral portions of the stacked structure covering on the substrate 100 and extending toward the peripheral region are therefore partially exposed. The mask layer 200 is preferably aligned to a center of the capacitor structure 150 and covers equal areas of the substrate 100. As shown in FIG. 2, by performing the etching process to remove the portions of the stacked structure not covered by the mask layer 200, the stacked structure is patterned. After patterning the stack layer, the remaining mask layer 200 is removed. The etching process removes the lateral portions of the stacked structure (including the semiconductor layer 181, the conductive layer 183 and the insulating layer 185) not covered by the mask layer 200, and the remaining lateral portions of the stacked structure respectively at two sides of the capacitor structure 150 may cover equal areas of the substrate 100.

Subsequently, as shown in FIG. 3, a dielectric layer 190 is formed on the substrate 100. At least a peripheral plug 195 is then formed in the dielectric layer 190 to electrically connect to at least an active device (not shown) in the peripheral region. Preferably, each peripheral plug 195 may be formed away from the lateral portions of the patterned stacked structure by a predetermined distance L to prevent the peripheral plug 195 from being in direct contact with the stacked structure. That may cause a circuit short failure. According to an embodiment, the active device may be a transistor, a conductive structure or a doping region that is formed in the peripheral region, but not limited thereto. The active device may be other types of devices according to design needs.

To this end, the semiconductor memory device according to the embodiment is obtained. In the first preferred embodiment as illustrated previously, the stacked structure is patterned by being covered by the mask layer 200 and etched through the mask layer 200. However, due to the process variation such as the photolithography-etching process for forming the mask layer 200 and etching the stacked structure through the mask layer 200, the lateral portions of the stacked structure may not be completely removed and would remain covering a region of the substrate 100 adjacent to two sides of the capacitor structure 150. The remaining lateral portions of the stacked structure at two sides of the capacitor structure 150 may adversely decrease the process window of forming the peripheral plug 195. Furthermore, since the length of the remaining lateral portion of the stacked structure along the second direction D2 is substantially determined by being covered by the mask layer 200, the process variation of the mask layer 200 such as misalignment may cause the lateral portion of the patterned stacked structure extending to a region on that the peripheral plug 195 to be formed and consequently causing short circuit between the peripheral plug 195 and the capacitor structure 150. To prevent the aforesaid problem, a spare space may be defined between the memory cell region and the peripheral region (or between the capacitor structures and the plug for connecting to a peripheral device) when designing the layout of the semiconductor memory device. For example, for a DRAM device of 28 nm-generation, the position of the peripheral plug 195 has to be away from the capacitor structure 150 by a spare space of at least around 360 nm. However, the area of the substrate 100 reserved for the spare space may be a hindrance for device shrinking.

Those skilled in the art should easily understand that the semiconductor device of the present invention may be formed by other methods rather than limited to the aforesaid manufacturing steps. Other embodiments or variations directed to the semiconductor devices and the manufacturing methods will be described in the following paragraphs. To simplify the disclosure, the following description will focus on and be directed to the different features between the embodiments rather than redundantly repeating similar components. In addition, like reference numerals will refer to like elements throughout the disclosure to facilitate comparison between the embodiments.

Figure 4:
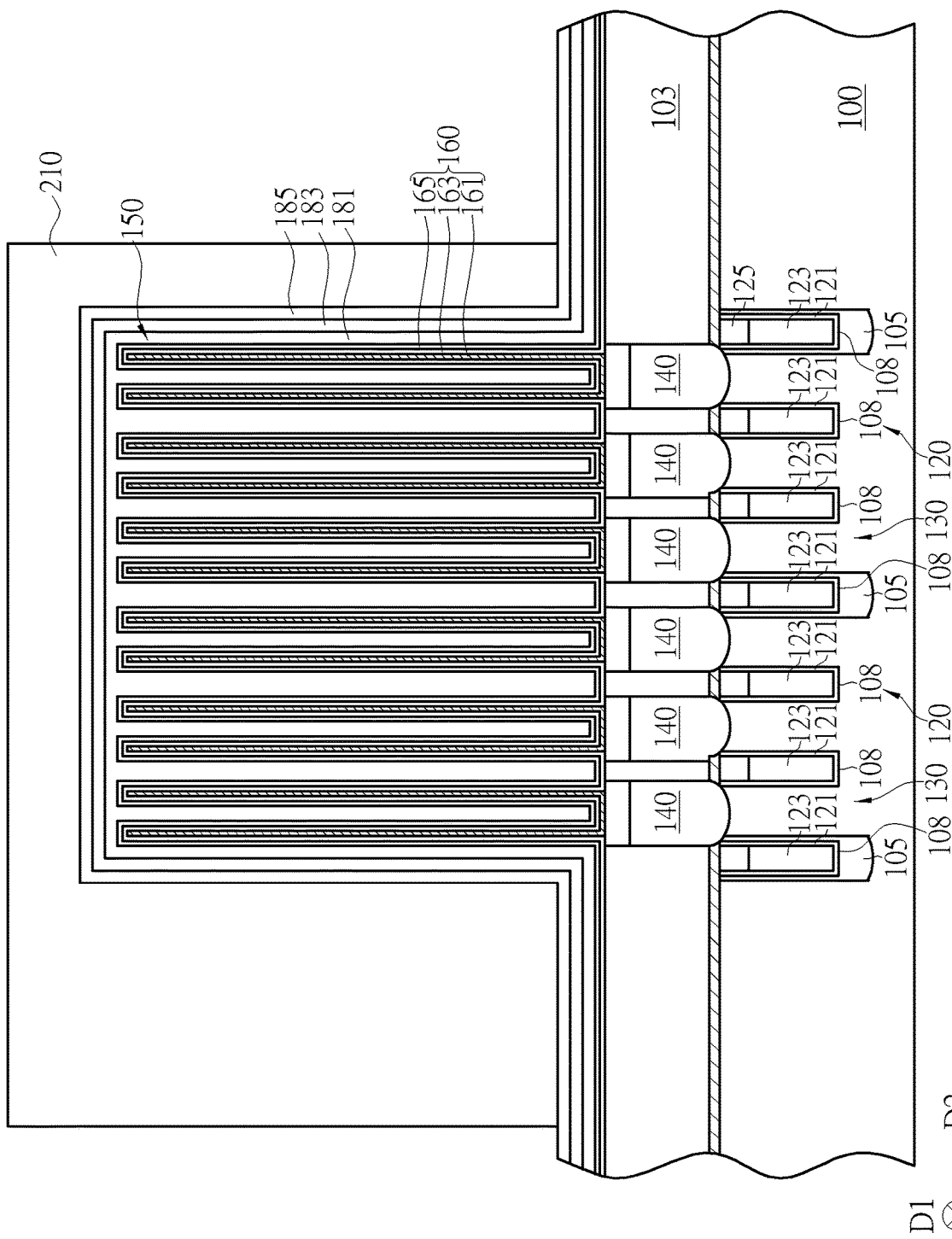
Figure 5:
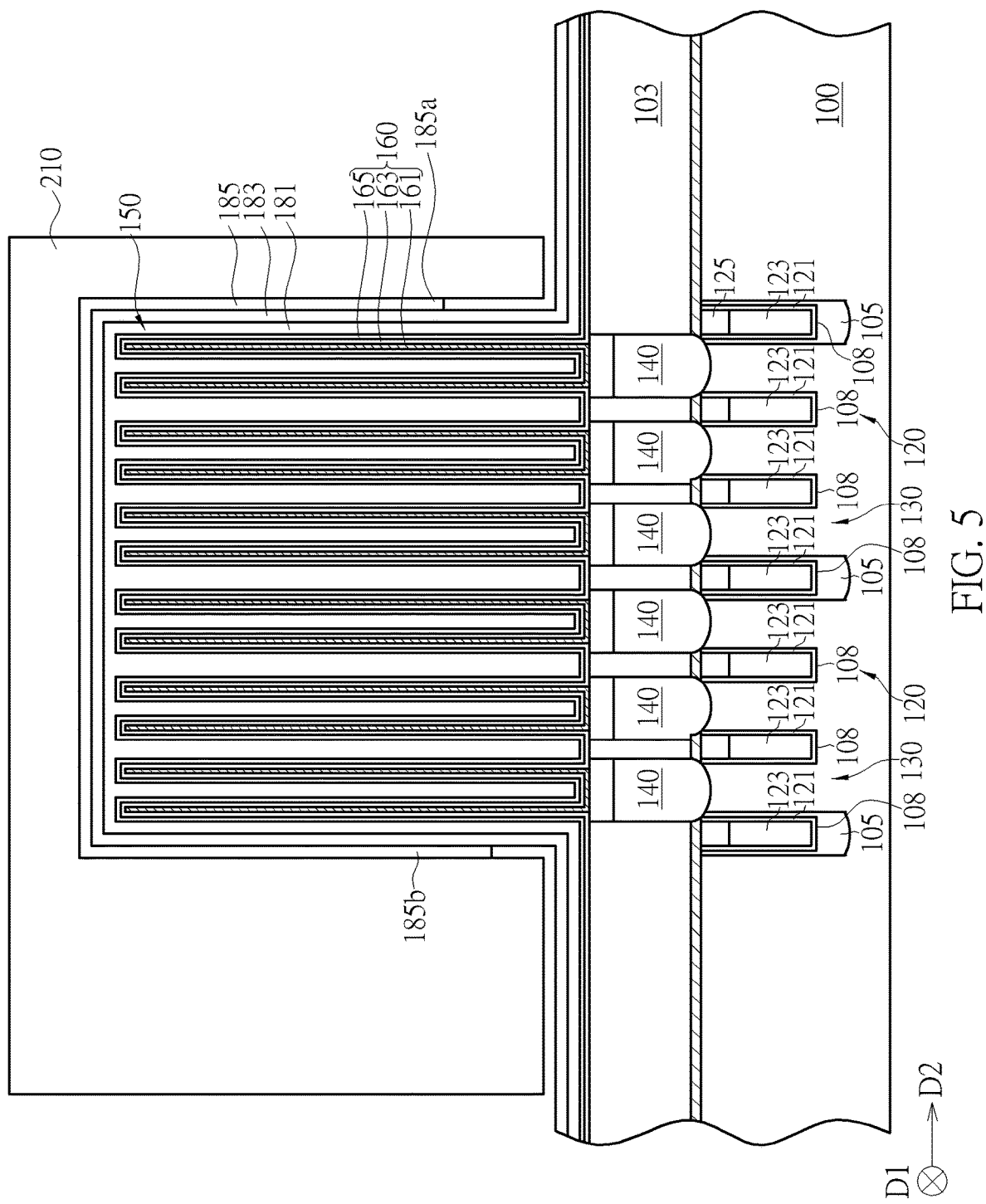
Figure 6:
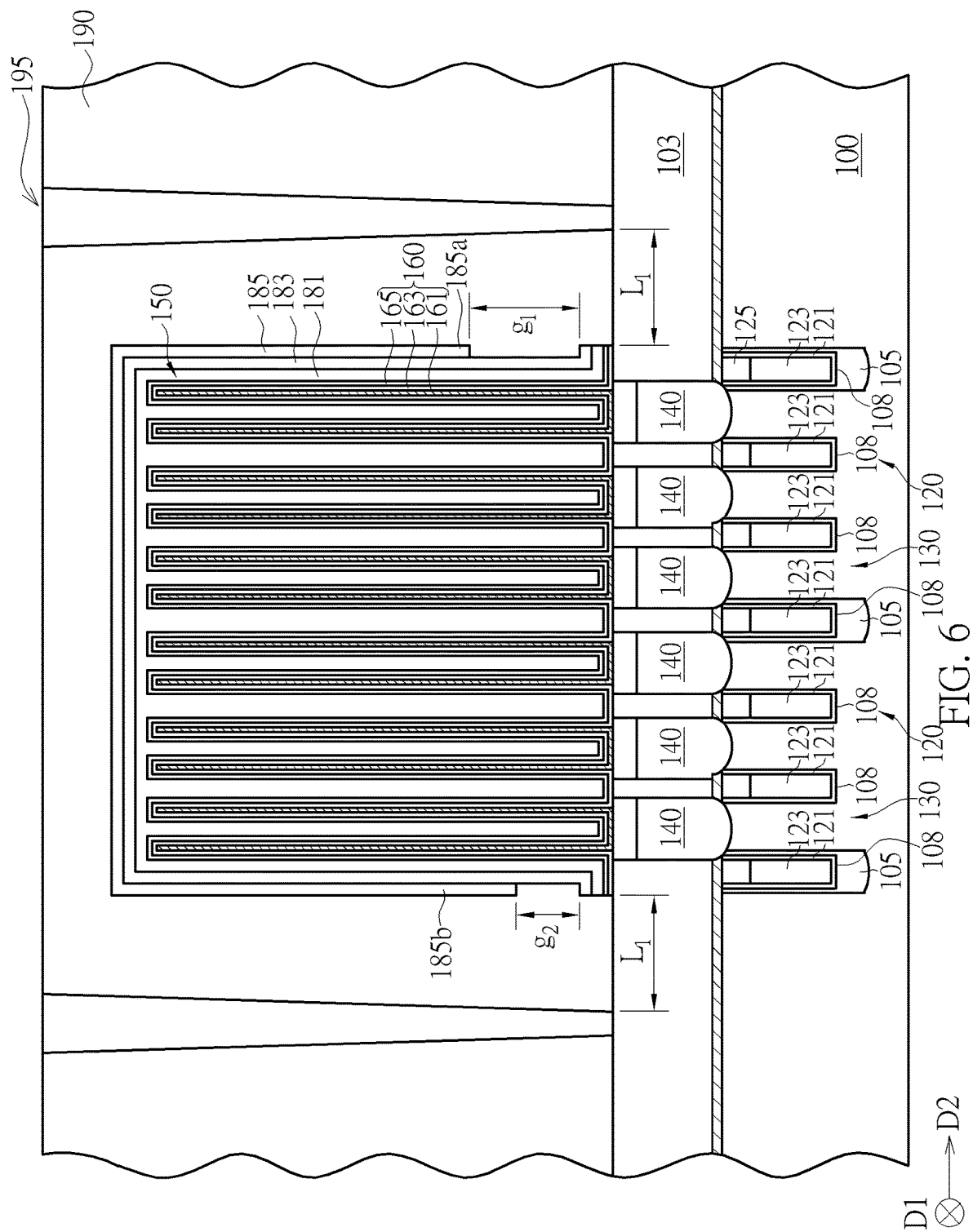

Please refer to FIG. 4 to FIG. 6, which are schematic cross-sectional diagrams illustrating the steps of forming a semiconductor memory device according to a second preferred embodiment of the present invention. The process and chosen materials for forming the structure as shown in FIG. 4 of the second preferred embodiment are similar to those in the first preferred embodiment shown in FIG. 1 to FIG. 3, and will not be narrated herein. The difference is that, in the second preferred embodiment, the stacked structure is patterned by being etched in a stage-by-stage manner by successively performing two etching processes.

As shown in FIG. 4, similarly, a mask layer 210 is formed on the substrate 100 and covering the stacked structure, the capacitor structure 150 and a portion of the substrate 100. In the illustrated embodiment, the mask layer 210 may completely cover the capacitor structure 150 and may be displaced from the center of the capacitor structure 150 and shift to one side of capacitor structure 150 by a certain distance. In other words, as shown in FIG. 4, the mask layer 210 covering on the sidewalls of the capacitor structure 150 may have different thicknesses along the second direction D2. In other embodiments, as shown in the first preferred embodiment previously illustrated, the mask layer 210 may be aligned with the center of the capacitor structure 150 and the mask layer 210 covering on the sidewalls of the capacitor structure 150 may have the same thickness.

Figure 7:
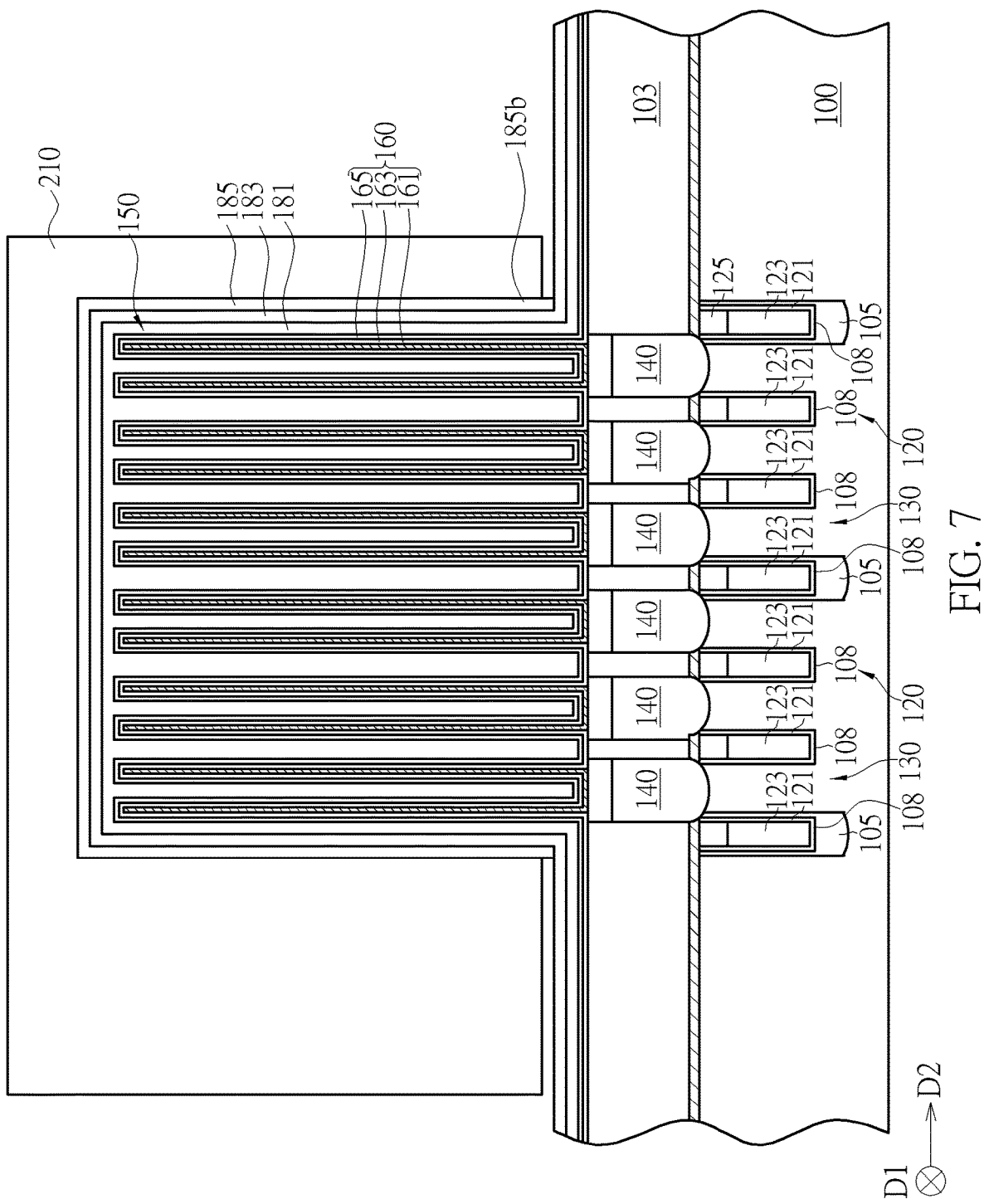
FIG. 7 is a schematic cross-sectional diagram of a semiconductor memory device according to another preferred embodiment of the present invention.

Please refer to FIG. 5. Afterward, using mask layer 210 covering on the capacitor structure 150, a first etching process is performed to remove the insulating layer 185 exposed from the mask layer 210 and further remove a portion of the insulating layer 185 covered by the mask layer 210, thereby obtaining a patterned insulating layer 185. According to an embodiment, the first etching process may be a wet etching process. The wet etching process may etch away the insulating layer 185 that is the uppermost layer of the stacked structure by using the underlying conductive layer 183 as an etching stop layer. The wet etching process may completely remove the lateral portion of the insulating layer 185 covering on the substrate 100 and further remove a portion of the vertical portion of the insulating layer 185 covering on the sidewalls of the capacitor structures 150. Consequently, the obtained patterned insulating layer 185 may have an upside-down U-shaped cross-sectional profile, as shown in FIG. 5. Furthermore, because the thicknesses (along the second direction D2) of the mask layer 210 on sidewalls of the capacitor structure 150 are different, the removal rate of the insulating layer 185 covered by the mask layer 210 may be different. Therefore, the removed lengths of the vertical portions of the insulating layer 185 on the sidewalls of the capacitor structure 150 may be different. For example, when the mask layer 210 covering on the left sidewall of the capacitor structure 150 is thicker, a longer length of the lateral portion of the insulating layer 185 under by the mask layer 210 at the left side of the capacitor structure 150 has to be removed during the wet etching process. Therefore, the vertical portion of the insulating layer 185 at the left side of the capacitor structure 150 may be removed by a smaller length with respect to the vertical portion of the insulating layer 185 at right side of the capacitor structure 150. As shown in FIG. 5 and FIG. 6, after the first etching process, the side portion 185a at the right side of the conductive structure 150 may be distanced from the lateral portions of the conductive layer 183 by a gap g1, and the side portion 185b at the left side of the conductive structure 150 may be distanced from the lateral portions of the conductive layer 183 by a gap g2. According to the embodiment, the gap g1 and the gap g2 may have different heights along the first direction D1. According to another embodiment as shown in FIG. 7, by adjusting the parameters of the wet etching process, the lateral portions of the insulating layer 185 covering on the substrate 100 may be completely removed without further removing any portion of the vertical portions of the insulating layer 185. The obtained patterned insulating layer 185 may also have an upside-down U-shaped cross-sectional profile and have the side portions 185a and 185b at two sides of the capacitor structure 150 respectively contacting the underlying lateral portions of the conductive layer 183.

After forming the patterned insulating layer 185, the mask layer 210 may be removed. Subsequently, a second etching process may be performed. The second etching process uses the patterned insulating layer 185 as an etching mask to etch away the conductive layer 183 and the semiconductor layer 181 not covered by the patterned insulating layer 185, thereby forming the patterned conductive layer 183 and the patterned semiconductor layer 181 as shown in FIG. 6. To this end, the stack structure is therefore completely patterned. Because the patterned insulating layer 185 only covers on the top surface and sidewalls of the capacitor structure 150, the patterned conductive layer 183 and the patterned semiconductor layer 181 may respectively have lateral portions at two sides of the capacitor structure 150 that are flush with the side portions 185a or the side portion 185b of the patterned insulating layer 185. In comparison with previous embodiment, the lengths of the lateral portions of the stacked structure at two sides of the capacitor structure 150 may be further reduced by the method disclosed in the second preferred embodiment. Thereafter, similarly, a dielectric layer 190 is formed on the substrate 100 and at least a peripheral plug 195 is formed in the dielectric layer 190 to electrically connected to an active device (not shown) in the peripheral region. The semiconductor memory device according to the second preferred embodiment is therefore obtained.

It is noteworthy that, in the second preferred embodiment, the layers of the stacked structure are etched in a stage-by-stage manner by successively performing two etching processes. Specifically, in a first stage of etching the stacked structure, the insulating layer 185 of the stacked structure is etched and thereby forming a patterned insulating layer 185 having an upside-down U-shaped cross-sectional profile. Afterward, in a second stage of etching the stacked structure, the other layers of the stacked structure underlying the insulating layer 185 (including the conductive layer 183 and the semiconductor layer 181) are etched using the patterned insulating layer 185 as an etching mask. The patterned insulating layer 185 has two side portions 185a and 185b respectively covering on the sidewalls of the capacitor structure 180 and spaced apart from the lateral portions of the conductive layer 183 by a gap g1 and a gap g2, respectively. The gap g1 and the gap g2 may have different heights along the first direction D1. In various embodiments, the side portions 185a and 185b of the patterned insulating layer 185 may be in direct contact with the lateral portions of the conductive layer 183. By using the patterned insulating layer 185 as an etching mask to etch and the conductive layer 183 and the semiconductor layer 181, the obtained patterned conductive layer 183 and patterned semiconductor layer 181 may respectively have lateral portions flush with the side portions 185a and 185b of the patterned insulating layer 185 along the first direction D1. In this way, the lengths of the lateral portions of the completely patterned stacked structure at two sides of the capacitor structure 150 may be greatly reduced. An increased distance L1 between the lateral portions of the stacked structure and the peripheral plug 195 larger than the distance L as shown in FIG. 3 may be obtained, which means that a larger process window for forming the peripheral plug 195 may be provided. Furthermore, the method illustrated in the second preferred embodiment may be able to control the lengths of the lateral portions of the stacked structure at two sides of the capacitor structure 150 in a more precise manner, thereby reducing the opportunity for the peripheral plug 195 to be in direct contact with the stacked structure and the short circuit between the capacitor structure 150 and the peripheral plug 195 may be avoided. Furthermore, with these advantages illustrated above, the spare space between the memory cell region and the peripheral region of the semiconductor memory device may be reduced. For example, for a DRAM device of 28 nm-generation, the spare space between the capacitor structure 150 and the peripheral plug 195 may be reduced from 360 nm, for example, to be between 30 nm and 50 nm. A higher degree of integrity and an increased device density may be achieved.

Figure 8:
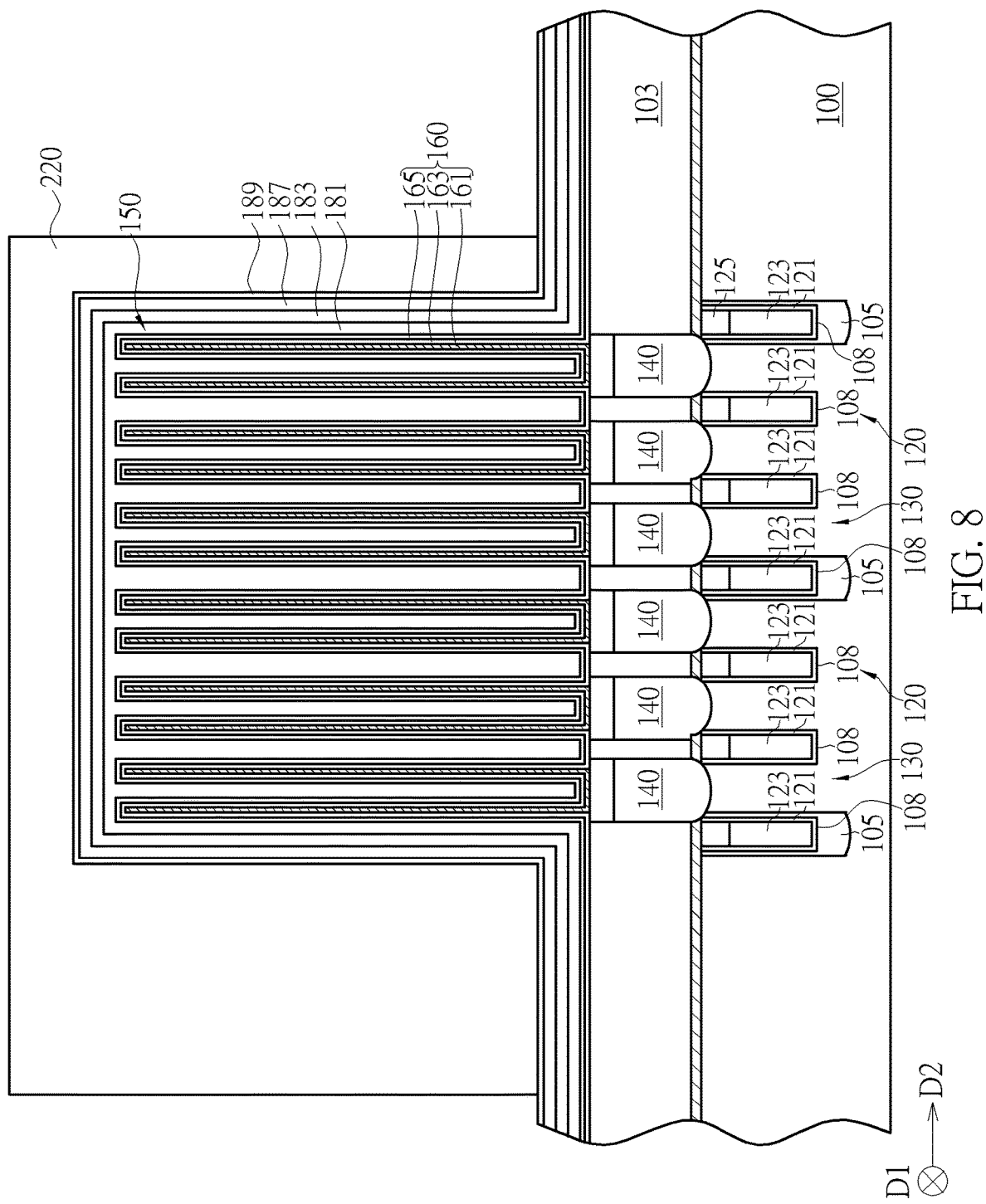

Please refer to FIG. 8 to FIG. 13, which are schematic cross-sectional diagrams illustrating the steps of forming a semiconductor memory device according to a third preferred embodiment of the present invention. The process and chosen materials for forming the structure as shown in FIG. 8 of the third preferred embodiment are similar to those in the first preferred embodiment and the second embodiment and will not be narrated herein. The difference is that, in the third preferred embodiment, the stacked structure is patterned by being etched in a stage-by-stage manner by successively performing multiple etching processes.

As shown in FIG. 8, the stacked structure may include, from bottom to top, a semiconductor layer 181, a conductive layer 183, a first insulating layer 187 and a second insulating layer 189. Preferably, the first insulating layer 187 and the second insulating layer 189 have an etching selectivity with respect to each other. The thickness of the second insulating layer 189 may be smaller than the thickness of the first insulating layer 187. For example, the first insulating layer 187 may include silicon nitride, the second insulating layer 189 may include silicon oxide, and the thickness of the second insulating layer 189 may be a half to one-fifth of the thickness of the first insulating layer 187, but not limited thereto. Afterward, a mask layer 220 is formed on the substrate 100 and covering the stacked structure, the capacitor structure 150 and a portion of the substrate 100. Optionally, as shown in FIG. 8, the mask layer 210 may be displaced from the center of the capacitor structure 150 and shift to one side of the capacitor structure 150 by a certain distance. Therefore the mask layer 220 respectively covering on the sidewalls of the capacitor structure 150 may have different thicknesses along the second direction D2, as shown in FIG. 8.

Figure 9:
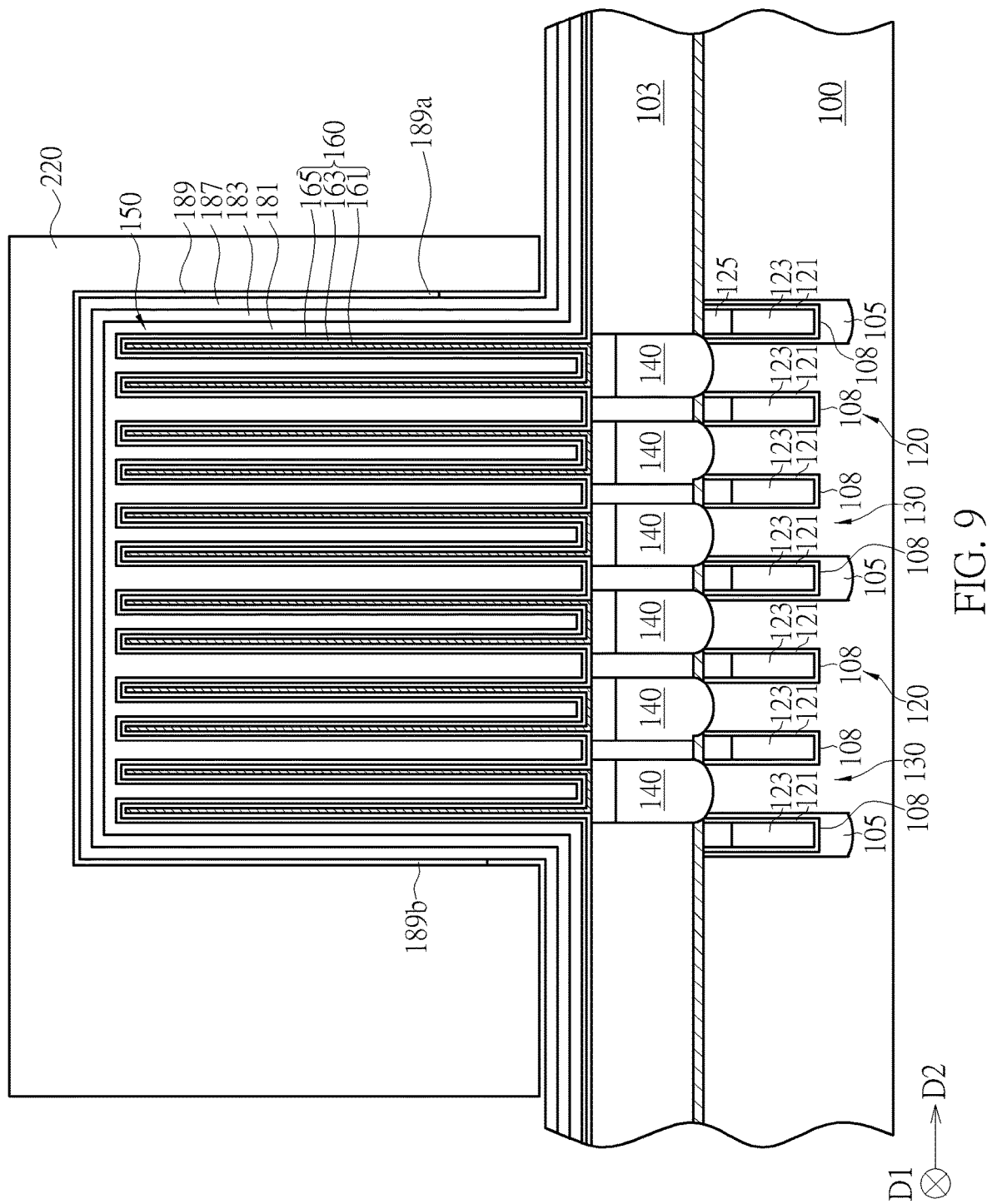
Figure 10:
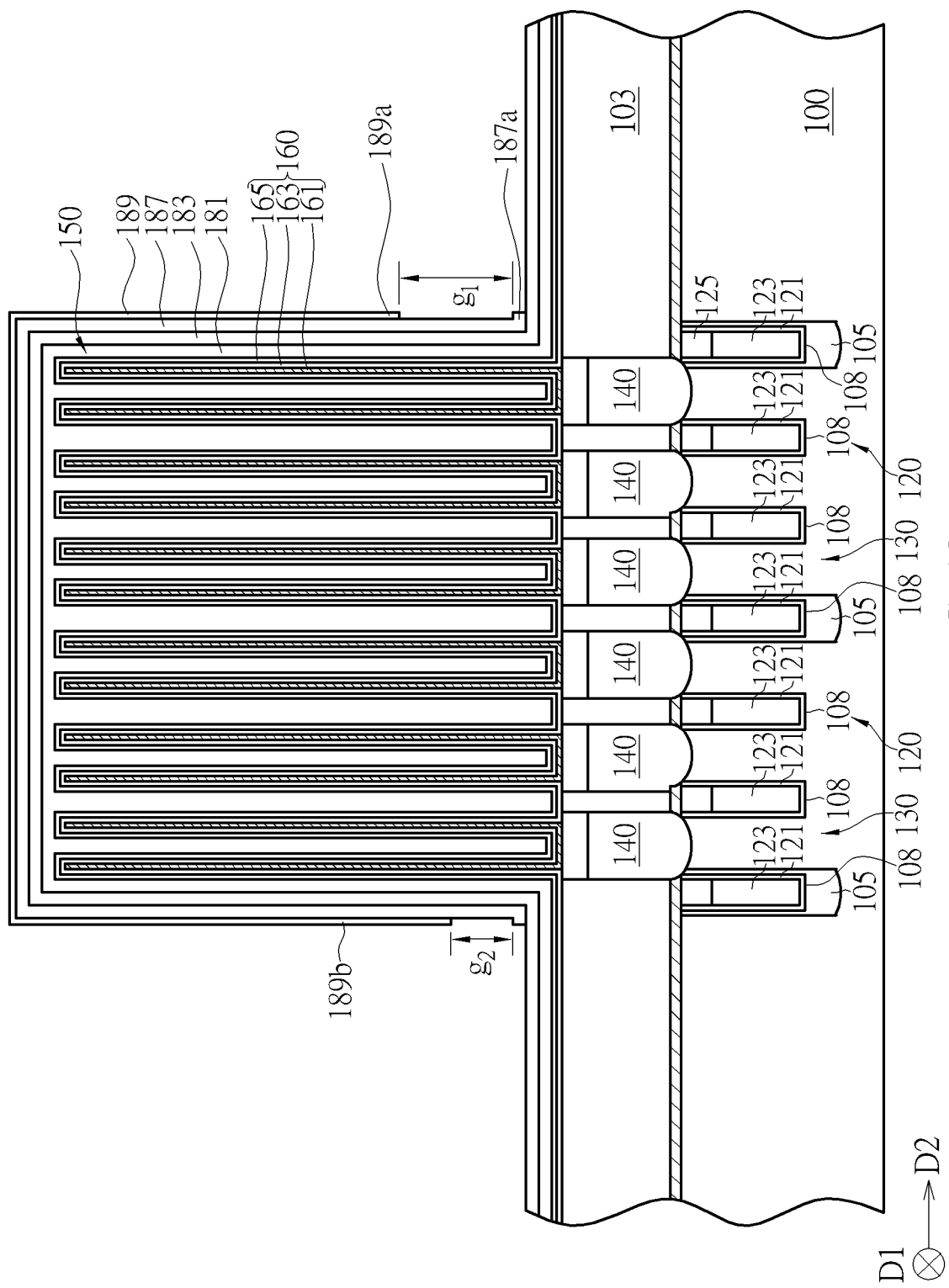

Please refer to FIG. 9. Afterward, as the capacitor structure 150 is covered by the mask layer 220, a first etching process is performed to remove the second insulating layer 189 exposed from the mask layer 220 and further remove a portion of the second insulating layer 189 covered by the mask layer 210, thereby obtaining a patterned second insulating layer 189. According to an embodiment, the first etching process may be a wet etching process. The wet etching process may etch away the second insulating layer 189 that is the uppermost layer of the stacked structure by using the first insulating layer 187 under the second insulating layer 189 as an etching stop layer. The wet etching process may completely remove the lateral portion of the second insulating layer 189 covering on the substrate 100 and further partially remove the vertical portion of the second insulating layer 189 covering on sidewalls of the capacitor structures 150, thereby the patterned second insulating layer 189 may have an un-side down U-shaped cross-sectional profile, as shown in FIG. 9. Similar to the second preferred embodiment as shown in FIG. 5, because the thicknesses of the mask layer 220 on the sidewalls of the capacitor structure 150 are different, the removal rate of the second insulating layer 189 under the mask layer 220 may be different. Therefore, the side portions 189a and 189b of the patterned second insulating layer 189 covering on sidewalls of the capacitor structure 150 may be distanced from the underneath lateral portion of the first insulating layer 187 by different gaps g1 and g2, respectively, as shown in FIG. 9 and FIG. 10.

After patterning second insulating layer 189, the mask layer 220 may be removed. Subsequently, a second etching process may be performed to partially remove the lateral portions of the first insulating layer 187 covering on the substrate. Specifically, the second etching process uses the patterned second insulating layer 189 as an etching mask to etch away the portion of the first insulating layer 187 not covered by the patterned second insulating layer 189, thereby obtaining a patterned first insulating layer 187 that may have lateral portions having small lengths and directly contacting the underlying conductive layer 183. As shown in FIG. 10, the patterned first insulating layer 187 may have a shoulder portion adjacent to the bottom of the capacitor structure 150.

Figure 11:
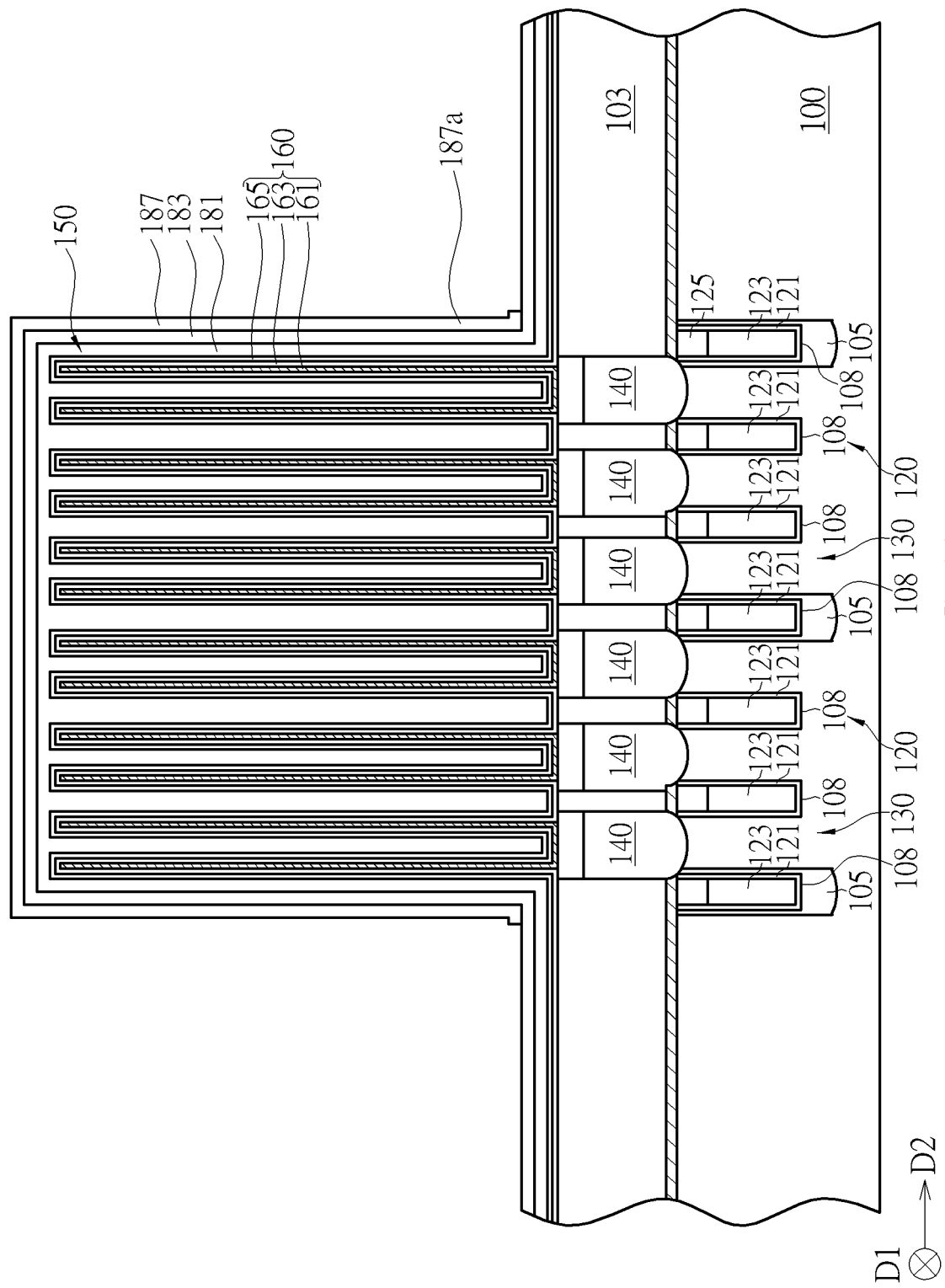
Figure 12:
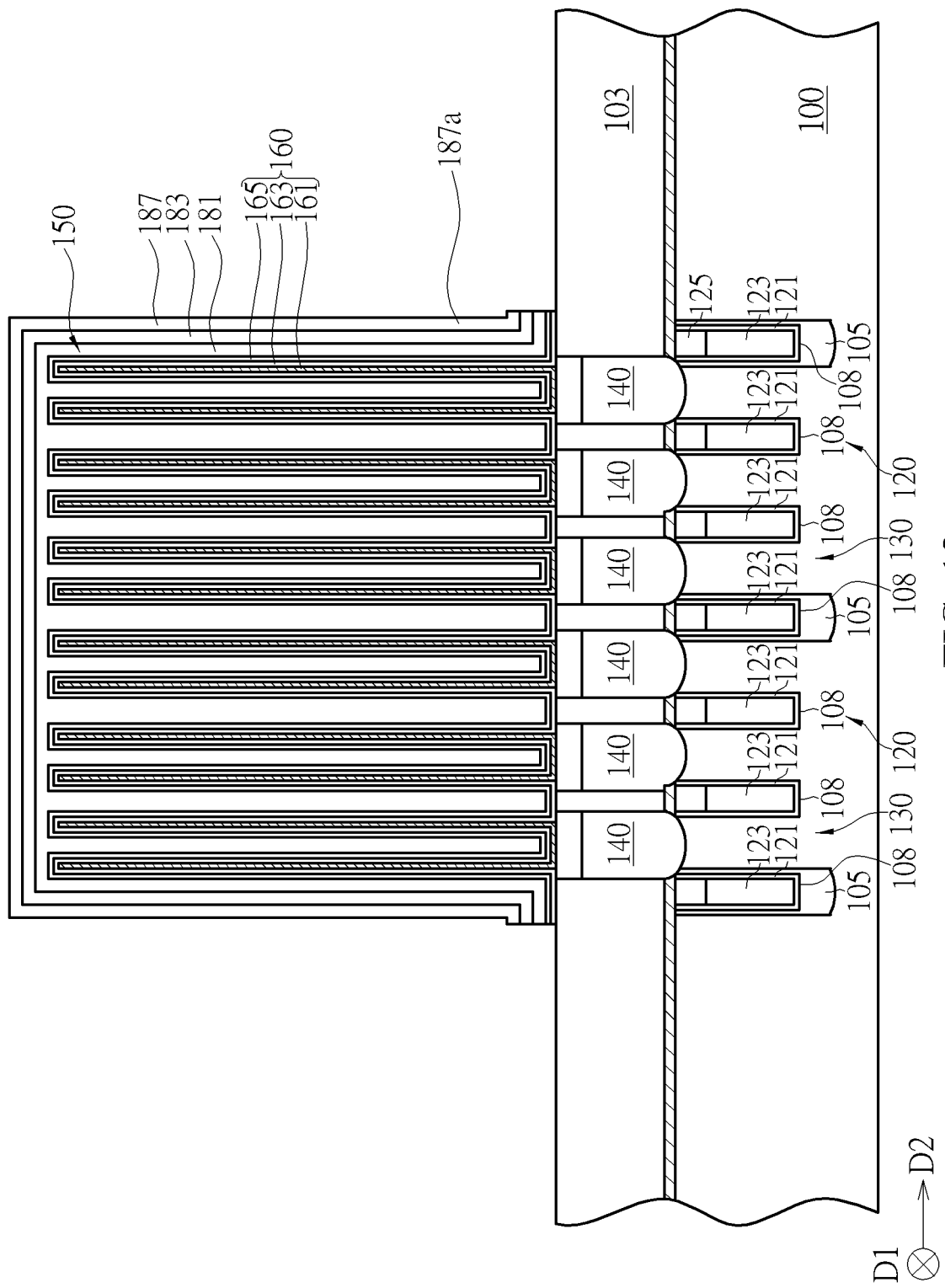
Figure 13:
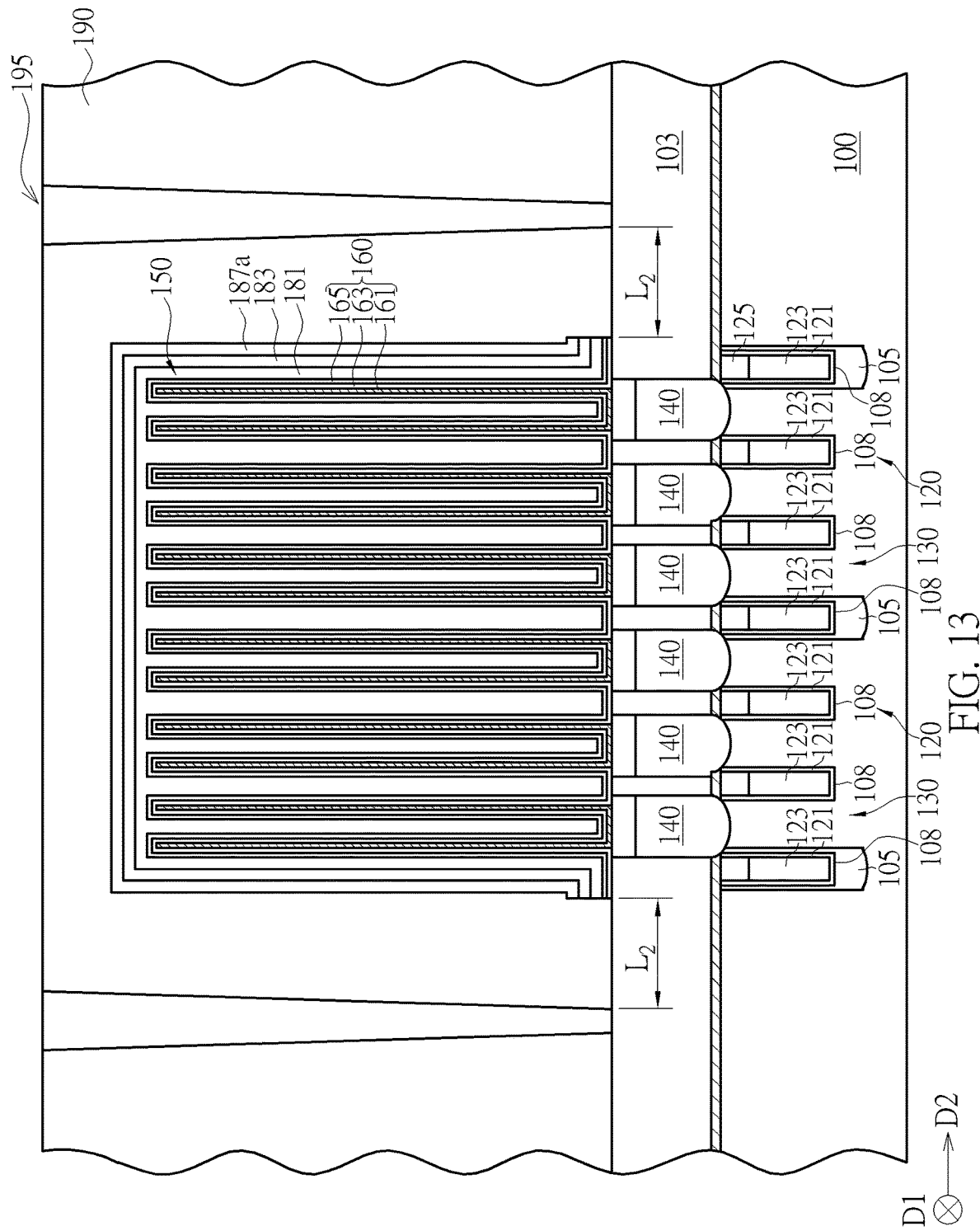

After patterning the first insulating layer 187, as shown in FIG. 11, the patterned second insulating layer 189 may be removed. Subsequently, a third etching process may be performed, using the patterned first insulating layer 187 as an etching mask to remove the lateral portions of the conductive layer 183 and the semiconductor layer 181 exposed from the patterned first insulating layer 187, thereby obtaining the patterned conductive layer 183 and the patterned semiconductor layer 181, as shown in FIG. 12. In this way, the patterned conductive layer 183 and the patterned semiconductor layer 181 may have lateral portions flush with the vertical portions of the patterned first insulating layer 187 that respectively cover on sidewalls of the capacitor structure 150. In other words, the lengths of the lateral portions of the stacked structure may be greatly reduced. Following, as shown in FIG. 13, a dielectric layer 190 is formed on the substrate 100 and at least a peripheral plug 195 is formed in the dielectric layer 190 to electrically connected to an active device (not shown) in the peripheral region. The semiconductor memory device according to the embodiment is therefore obtained.

It is noteworthy that, in the third preferred embodiment, the layers of the stacked structure are etched in a stage-by-stage manner by successively performing multiple etching processes. Specifically, in a first stage of etching the stacked structure, the second insulating layer 189 of the stacked structure is etched and thereby forming a patterned second insulating layer 189 having an upside-down U-shaped cross-sectional profile. Afterward, the pattern of the patterned second insulating layer 189 is successively transferred to the first insulating layer 187, the conductive layer 183 and the semiconductor layer 181 by performing a series of etching processes. In this way, the lengths of the lateral portions of the stacked structure may be reduced to a desired length by performing the multiple etching processes, and an increased distance L2 between the lateral portions of the stacked structure and the peripheral plug 195 may be obtained. Therefore, a larger process window for forming the peripheral plug 195 may be provided. A higher degree of integrity and an increased device density may also be achieved. It should be understood that the method of etching the stacked structure by successively performing three etching processes as previously illustrated are only for example and should not limit the scope of the present invention. In various embodiments, more etching processes may be performed to etch the stacked structure according to product requirements. For example, according to an embodiment, more than three etching processes may be performed to successively etching the stack layers of the stacked structure, thereby further reducing the lengths of the lateral portions of the stacked structure for a larger process window.

Figure 14:
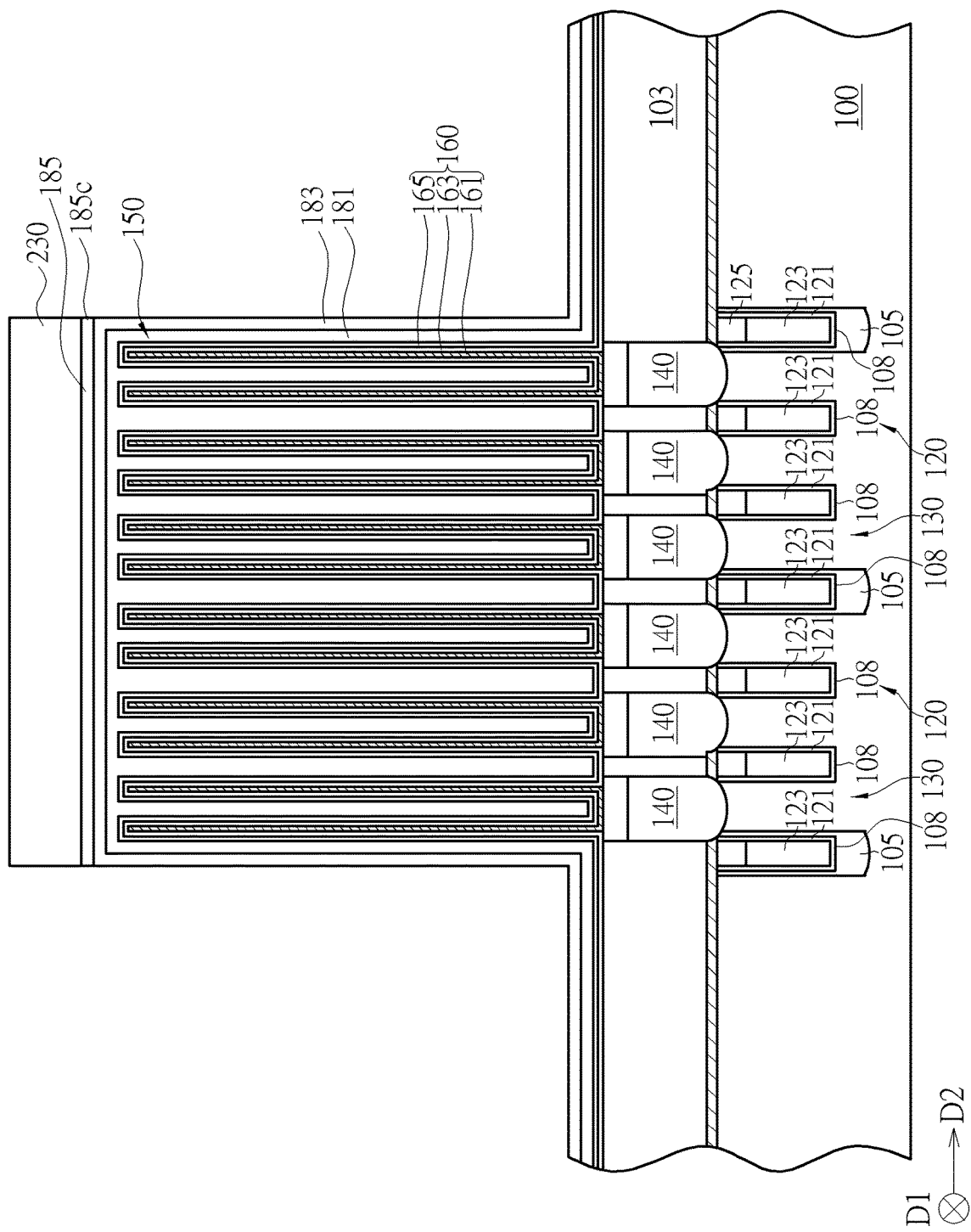
FIG. 14 is a schematic cross-sectional diagram of a semiconductor memory device according to a fourth preferred embodiment of the present invention.

Please refer to FIG. 14, which is a schematic cross-sectional diagram of a semiconductor memory device according to a fourth preferred embodiment of the present invention. The process and chosen materials for forming the structure as shown in FIG. 14 of the second preferred embodiment are similar to those in the first preferred embodiment, and will not be narrated herein. The difference is that, in the fourth preferred embodiment, the mask layer 230 is only formed on the top surface of the capacitor structure 150.

As shown in FIG. 14, similarly, after forming the stacked structure covering the capacitor structure 150, a mask layer 230 is formed on the stacked structure and only covers the portion of the stacked structure directly on the top surface of the capacitor structure 150. The insulating layer 185 of the stacked structure on sidewalls of the capacitor structure 150 is exposed from the mask layer 230. Afterward, an etching process is performed, using the mask layer 230 as an etching mask to remove the portion of the insulating layer 185 exposed from the mask layer 230, thereby obtaining a patterned insulating layer 185. In the fourth preferred embodiment, the vertical portions of the conductive layer 183 on sidewalls of the capacitor structure 150 are directly employed as an etching stop layer for the first etching process, and therefore the obtained patterned insulating layer 185 may have side portions 185c flush with the vertical portions of the conductive layer 183, as shown in FIG. 14.

After patterning the insulating layer, the mask layer 230 may be removed. Another etching process using the patterned insulating layer 185 may be performed to etch the conductive layer 183 and the semiconductor layer 181, thereby obtaining a patterned conductive layer 183 and a patterned semiconductor layer 181. Preferably, the lateral portions of the conductive layer 183 may be completely removed, and the lateral portions of the stacked structure may be greatly reduced. Afterward, similarly, a dielectric layer (not shown) may be formed on the substrate 100 and a plug (not shown) may be formed in the dielectric layer, thereby obtaining the semiconductor memory device according to the embodiment. The method disclosed in the fourth embodiment may achieve the purpose of reducing the lengths of the lateral portions of the stacked structure by fewer process steps with respect to other embodiments by forming the mask layer 230 only covering the top surface of the capacitor structure 150.

Overall, the method provided by the present invention removes the lateral portions of the stacked structure that cover on the substrate and extend toward the peripheral portion in a stage-by-stage manner by successively performing multiple etching processes including a wet etching process. In this way, most of the lateral portions of the stacked structure may be removed and the remaining lateral portions of the stacked structure may have significantly small lengths that may not extend to a region on which the plugs for connecting the peripheral devices may be formed. Therefore, the problems of short circuit between the capacitor structure and the plugs may be avoided. The method provided by the present invention may have an enlarged process window for forming the plugs and increase the device reliability of the semiconductor memory device formed therefrom. Furthermore, by using the method provided by the present invention, the spare space between the memory cell region and the peripheral region of the semiconductor memory device may be reduced and therefore a higher degree of integrity and an increased device density may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
    providing a substrate;
    forming a capacitor structure on the substrate, the capacitor structure comprising a plurality of capacitor;
    forming a stacked structure on the capacitor structure, covering the capacitor structure and a portion of the substrate, the stacked structure comprising an insulating layer;
    forming a mask layer covering the stacked structure and the capacitor structure;
    performing a first etching process through the mask layer, to partially remove the insulating layer to form a patterned insulating layer; and
    performing a second etching process through the patterned insulating layer after removing the mask layer to further remove the stacked structure to form a patterned stacked structure.

2. The method of forming a semiconductor memory device according to claim 1, wherein the first etching process is performed to completely remove the insulating layer exposed from the mask layer, and to partially remove the insulating layer covered by the mask layer.

3. The method of forming a semiconductor memory device according to claim 1, wherein the stacked structure further comprises a semiconductor layer under the insulating layer and a conductive layer between the insulating layer and the semiconductor layer, and the second etching process is performed to remove a portion of the conductive layer and a portion of the semiconductor layer to expose the substrate at two sides of the capacitor structure.

4. The method of forming a semiconductor memory device according to claim 3, wherein after the first etching process, a gap is formed between a lateral portion of the conductive layer and a side portion of the patterned insulating layer.

5. The method of forming a semiconductor memory device according to claim 1, wherein the mask layer only covers a top surface of the capacitor structure.

6. The method of forming a semiconductor memory device according to claim 1, wherein the mask layer covering on two sidewalls of the capacitor structure have different thicknesses.

7. The method of forming a semiconductor memory device according to claim 1, wherein the stacked structure further comprises a first insulating layer under the insulating layer, a conductive layer under the first insulating layer and a semiconductor layer under the conductive layer, and the second etching process is performed to remove a portion of the first insulating layer to form a patterned first insulating layer.

8. The method of forming a semiconductor memory device according to claim 7, further comprising:
    after the second etching process, removing the patterned insulating layer completely; and
    performing a third etching process through the patterned first insulating layer to remove a portion of the conductive layer and a portion of the semiconductor layer to expose the substrate at the two sides of the capacitor structure.

9. The method of forming a semiconductor memory device according to claim 7, wherein the patterned first insulating layer has a shoulder portion adjacent to a bottom of the capacitor structure.

10. The method of forming a semiconductor memory device according to claim 7, wherein the insulating layer and the first insulating layer have different materials.

11. The method of forming a semiconductor memory device according to claim 1, further comprising:
    forming a plurality of gates in the substrate; and
    forming a plurality of cell plugs on the substrate, the cell plugs being electrically connected to each of the capacitors and the substrate at two sides of the gates, wherein each of the capacitors comprises a bottom electrode, a capacitor dielectric layer and a top electrode, wherein the bottom electrode directly contacts one of the cell plugs.

12. The method of forming a semiconductor memory device according to claim 11, wherein the substrate has a periphery region and a memory cell region, the capacitor structure and the gates are formed within the memory cell region, and the method further comprises:
　forming at least one active device within the periphery region; and
　forming a peripheral plug on the substrate to electrically connect to the active device, wherein the peripheral plug is not directly in contact with the capacitor structure and the stacked structure.

* * * * *